(12) United States Patent
Peng et al.

(10) Patent No.: US 8,120,448 B2
(45) Date of Patent: Feb. 21, 2012

(54) HIGH FREQUENCY NANOTUBE OSCILLATOR

(75) Inventors: Haibing Peng, Houston, TX (US); Alexander K. Zettl, Kensington, TX (US)

(73) Assignee: The Regents of the University of California, Oakland, CA (US)

( * ) Notice: Subject to any disclaimer, the term of this patent is extended or adjusted under 35 U.S.C. 154(b) by 311 days.

(21) Appl. No.: 12/446,231

(22) PCT Filed: Oct. 19, 2007

(86) PCT No.: PCT/US2007/082016
§ 371 (c)(1),
(2), (4) Date: Jul. 10, 2009

(87) PCT Pub. No.: WO2008/049122
PCT Pub. Date: Apr. 24, 2008

(65) Prior Publication Data
US 2010/0214034 A1    Aug. 26, 2010

Related U.S. Application Data

(60) Provisional application No. 60/852,903, filed on Oct. 19, 2006.

(51) Int. Cl.
*H03H 9/24* (2006.01)
*H03B 5/30* (2006.01)

(52) U.S. Cl. ........ 333/186; 333/200; 331/154; 331/156; 977/742; 977/748; 977/847; 977/932

(58) Field of Classification Search .......... 333/186, 333/200; 977/701, 720, 721, 724, 733, 742, 977/745, 748, 750, 752, 932, 936–938, 762, 977/840, 842, 847; 331/154, 156; 257/24, 257/25, 414, 415
See application file for complete search history.

(56) References Cited

U.S. PATENT DOCUMENTS

| 4,137,511 A | 1/1979 | Jones |
| 5,082,795 A | 1/1992 | Temple |
| 5,641,466 A | 6/1997 | Ebbesen et al. |
| 5,997,832 A | 12/1999 | Lieber et al. |
| 6,036,774 A | 3/2000 | Lieber et al. |

(Continued)

OTHER PUBLICATIONS

K. Jensen et al.; "Limits of Nanomechanical Resonators"; 2006 IEEE ICONN '06 International Conference on Nanoscience and Nanotechnology, pp. 68-71, issue date Jul. 3-7, 2006.*

(Continued)

*Primary Examiner* — Barbara Summons
(74) *Attorney, Agent, or Firm* — Leonard T. Guzman; Lawrence Berkeley; National Laboratory

(57) ABSTRACT

A tunable nanostructure such as a nanotube is used to make an electromechanical oscillator. The mechanically oscillating nanotube can be provided with inertial clamps in the form of metal beads. The metal beads serve to clamp the nanotube so that the fundamental resonance frequency is in the microwave range, i.e., greater than at least 1 GHz, and up to 4 GHz and beyond. An electric current can be run through the nanotube to cause the metal beads to move along the nanotube and changing the length of the intervening nanotube segments. The oscillator can operate at ambient temperature and in air without significant loss of resonance quality. The nanotube is can be fabricated in a semiconductor style process and the device can be provided with source, drain, and gate electrodes, which may be connected to appropriate circuitry for driving and measuring the oscillation. Novel driving and measuring circuits are also disclosed.

5 Claims, 5 Drawing Sheets

U.S. PATENT DOCUMENTS

| | | | |
|---|---|---|---|
| 6,737,939 B2 | 5/2004 | Hoppe et al. | |
| 6,756,795 B2 | 6/2004 | Hunt et al. | |
| 6,803,840 B2 | 10/2004 | Hunt et al. | |
| 6,962,823 B2 | 11/2005 | Empedocles et al. | |
| 2006/0057767 A1 | 3/2006 | Regan et al. | |
| 2006/0118782 A1 | 6/2006 | Zettl et al. | |
| 2006/0197076 A1* | 9/2006 | Adam | 257/25 |
| 2008/0068000 A1* | 3/2008 | Bargatin et al. | 324/76.11 |
| 2008/0261342 A1* | 10/2008 | Zhou | 438/49 |

OTHER PUBLICATIONS

IEEE Xplore—Abstract Page for K. Jensen et al. article "Limits of Nanomechanical Resonators", issue date Jul. 3-7, 2006, one page.*
S. Li et al.; "Carbon Nanotube GHz Nano-Resonator"; 2004 IEEE MTT-S International Microwave Symposium Digest, vol. 2, pp. 987-990, issue date Jun. 6-11, 2004.*
IEEE Xplore—Abstract Page for S. Li et al. article "Carbon Nanotube GHz Nano-Resonator", issue date Jun. 6-11, 2004, one page.*
Peng et al., "Ultrahigh Frequency Nanotube Resonators," Physical Review Letters, vol. 97, pp. 087203-1-087203-4, (Aug. 22, 2006).
Sazonova et al., "A tunable carbon nanotube electromechanical oscillator," Nature, vol. 431, pp. 284-287, (Sep. 16, 2004).
Kong et al., "Synthesis of individual singlewalled carbon nanotubes on patterned siliconwafers," Nature, vol. 395, pp. 878-881, (Oct. 29, 1998).
Knobel et al., "Nanometre-scale displacement sensing using a single electron transistor," Nature, vol. 424, pp. 291-293, (Jul. 17, 2003).
Huang et al., "Nanoelectrical Systems: Nanodevice motion at microwave frequencies," Nature, vol. 421, p. 496, (Jan. 30, 2003).
Endo et al., "The Production and Structure of Pyrolytic Carbon Nanotubes (PCNTs)," Journal of Physics and Chemistry of Solids, vol. 54, No. 12, pp. 1841-1848, (1993).
Terrones et al., "Controlled production of aligned-nanotube bundles," Nature, vol. 388, pp. 52-55, (Jul. 3, 1997).
Kyotani et al., "Preparation of Ultrafine Carbon Tubes in Nanochannels of an Anodic Aluminum Oxide Film," Chemistry of Materials, vol. 8, No. 8, pp. 2109-2113, (1996).
Ono et al., "Magnetic orderings in Al nanowires suspended between electrodes," Applied Physics Letters, vol. 82, No. 25, pp. 4570-4572, (Jun. 23, 2003).
Geng et al., "Synthesis and optical properties of S-doped ZnO nanowires," Applied Physics Letters, vol. 82, No. 26, pp. 4791-4793, (Jun. 30, 2003).
Chen et al., "Self-assembled growth of epitaxial erbium disilicide nanowires on silicon (001)," Applied Physics Letters, vol. 76, No. 26, pp. 4004-4006, (Jun. 26, 2000).
Englander et al., "Local synthesis of silicon nanowires and carbon nanotubes on microbridges," Applied Physics Letters, vol. 82, No. 26, pp. 4797-4799, (Jun. 30, 2003).
Zhang et al., "Heterostructures of Single-Walled Carbon Nanotubes and Carbide Nanorods," Science, vol. 285, No. 5434, pp. 1719-1722, (Sep. 10, 1999).
Salem et al., "Multi-components nanorods for vaccination applications," Nanotechnology, vol. 16, pp. 484-487, (Feb. 11, 2005).
Scofield, "Frequency-domain description of a lock-in amplifier," American Journal of Physics, vol. 62, No. 2., pp. 129-133, (Feb. 1994).
Tombler et al., "Reversible electromechanical characteristics of carbon nanotubes under local-probe manipulation," Nature. vol. 405, pp. 769-772, (Jun. 15, 2000).
Gao et al., "Spiral Spin Order of Self-Assembled Co Nanodisk Arrays," Physical Review Letters, vol. 96, pp. 137205-1-137205-4, (Apr. 7, 2006).
Zettl, "Non-Carbon Nanotubes**," Advanced Materials, vol. 8, No. 5, pp. 443-445, (1996).
Sun et al., "Metal Nanostructures with Hollow Interiors**," Advanced Materials, vol. 15, No. 7-8, pp. 641-646, (Apr. 17, 2003).
Flauhaut et al., "Synthesis of single-walled carbon nanotube-Co-Mg-O composite powders and extraction of the nanotubes," Journal of Materials Chemistry, vol. 10, No. 2, pp. 249-252, (2000).
Peng et al., "Coaxial p- and n-type carbon nanotube transistors with dopant-selective coatings," Condensed Matter, arXiv:Cond-Mat/0508670, pp. 1-15, (Aug. 29, 2005).
Peng et al., "Microwave electromechanical resonator consisting of clamped carbon nanotubes in an abacus arrangement," Physical Review B, vol. 76, pp. 035405-1-035405-4, (Jul. 6, 2007).
Titus, "Myosins meet microtubules," Nature, vol. 431, pp. 252-253, (Sep. 16, 2004).
Cleland, "Carbon nanotubes tune up," Nature, vol. 431, pp. 251-252, (Sep. 16, 2004).
Craighead, "Nanoelectromechanical Systems," Science, vol. 290, pp. 1532-1535, (Nov. 24, 2000).
Schwab et al., "Putting Mechanics into Quantum Mechanics," Physics Today, vol. 58, No. 7, pp. 36-42, (Jul. 2005).
Peng et al., "Patterned growth of single-walled carbon nanotube arrays from a vapor-deposited Fe catalyst," Applied Physics Letters, vol. 83, No. 20, pp. 4238-4240, (Nov. 17, 2003).
Peng et al., "Coulomb blockade in suspended Si3N4-coated single-walled carbon nanotubes," Applied Physics Letters, vol. 84, No. 26, pp. 5428-5430, (Jun. 28, 2004).
Cao et al., "Suspended Carbon Nanotube Quantum Wires with Two Gates," Small Journal, No. 1, pp. 138-141, (Sep. 16, 2004).
Regan et al., "Carbon nanotubes as nanoscale mass conveyors," Nature, vol. 428, pp. 924-927 (Apr. 29, 2004).
"Carbon Nanotubes: Synthesis, structure, properties, and applications," Edited by M.S. Dresselhaus, Springer, pp. 287-327, (2001).
Geller et al., "Friction in nanoelectromechanical systems: Clamping loss in the GHz regime," Cond-Mat/0512710, pp. 1-5, (Dec. 29, 2005).
Lifshitz et al., "Thermoelastic damping in micro- and nanomechanical systems," Physical Review B, vol. 61, No. 8, pp. 5600-5609, (Feb. 15, 2000).
Bhiladvala et al., "Effect of fluids on the Q factor and resonance frequency of oscillating micrometer and nanometer scale beams," Physical Review E, vol. 69, pp. 036307-1-036307-5, (Mar. 31, 2004).
Blom et al., "Dependence of the quality factor of micromachined silicon beam resonators on pressure and geometry," Journal of Vacuum Science and Technololgy B, vol. 10, No. 1, pp. 19-26, (Jan./Feb. 1992).
Yum et al., "Experimental measurement and model analysis of damping effect in nanoscale mechanical beam resonators in air," Journal of Applied Physics, vol. 96, No. 7, pp. 3933-3938, (Oct. 1, 2004).

* cited by examiner

HIGH FREQUENCY NANOTUBE OSCILLATOR

CROSS-REFERENCE TO RELATED APPLICATIONS

This application claims priority to U.S. Provisional Patent Application 60/852,903, filed Oct. 19, 2006, which is incorporated by reference herein.

STATEMENT OF GOVERNMENTAL SUPPORT

This invention was made with U.S. Government support under Contract Number DE-AC02-05CH11231 between the U.S. Department of Energy and The Regents of the University of California for the management and operation of the Lawrence Berkeley National Laboratory, and under NSF Grant No. EEC-0425914. The U.S. Government has certain rights in this invention.

TECHNICAL FIELD

The present invention relates to the field of nano-electromechanical systems operating at ultrahigh (microwave) frequencies, in particular devices constructed with nanotubes and the like (i.e., nanostructures) and operating as oscillators in the microwave range and beyond.

BACKGROUND ART

It has been said that the miniaturization of electronic devices has revolutionized the technology of today, while the miniaturization of mechanical devices will revolutionize the technology of the future. Nanoelectromechanical systems (NEMS) with molecular-scale components operating at ultrahigh (microwave) frequencies promise applications ranging from single-atom mass and force sensing to efficient energy conversion systems to quantum computation. Despite recent nanotechnology advances facilitating the construction of very small-scale devices, a seemingly insurmountable barrier has been the realization of practical (i.e., operating at room temperature in atmospheric pressure) ultrahigh frequency mechanical oscillators. The challenge is two-fold: materials must be fabricated with nanoscale dimensions and with relatively defect-free surfaces, and detection methods with suitable sensitivity to the ultra-small displacements must be employed.

Exemplified below are the construction and operation of nanotube-based "nano-abacus" devices functioning as self-detecting NEMS oscillators, capable of operating in ambient-pressure air at room temperature with fundamental resonance frequency near 4 GHz. Such devices are referred to as "abacus" devices because they can, in one embodiment, take the form of moveable beads on a wire. Specialized nonlinear mixing methods are used to detect the resonance. The devices are individually tunable post-production and suitable for practical microwave frequency NEMS applications.

U.S. Pat. No. 4,137,511 to Jones, issued Jan. 30, 1979, entitled "Electromechanical filter and resonator," describes an electromechanical filter or resonator in the form of a single planar body comprises an elongated torsionally vibrating member, and a flexurally vibrating resonating element coupled along its nodal axis to the member. A pair of electromechanical transducers is attached to at least one side of the resonating element for exciting and/or detecting mechanical vibrations in the filter or resonator. Mounting sections located at both ends of the member are used to attach the filter or resonator to a base.

U.S. Pat. No. 6,803,840 to Hunt, et al., issued Oct. 12, 2004, entitled "Pattern-aligned carbon nanotube growth and tunable resonator apparatus," discloses an oscillator device comprising a suspended nanotube, designed such that injecting charge density into the tube (e.g., by applying a capacitively-coupled voltage bias) changes the resonant frequency of the nanotube, and where exposing the resonator to an RF bias induces oscillatory movement in the suspended portion of the nanotube, forming a nanoscale resonator, as well as a force sensor when operated in an inverse mode.

U.S. Pat. No. 6,756,795 to Hunt, et al., issued Jun. 29, 2004, entitled "Carbon nanobimorph actuator and sensor," discloses nanomechanical actuator/oscillator device nanotubes, designed such that inducing a difference in charge density between the tubes (e.g., by biasing one tube positive with respect to the other with sufficient tube-to-tube contact resistance) induces lateral movement in the end of the bimorph, forming a nanoscale resonator.

U.S. Pat. No. 6,737,939 to Hoppe, et al., issued May 18, 2004, entitled "Carbon nanotube array RF filter," discloses a tunable nanomechanical resonator system comprising an array of nanotubes, where the nanotubes are in signal communication with means for inducing a difference in charge density in the nanotube such that the mechanical resonant frequency of the nanotube can be tuned. The nanotube is in signal communication with a waveguide or other RF bias conduit such that an RF signal having a frequency corresponding to the mechanical resonant frequency of the array will couple to the array thereby inducing resonant motion in the array of nanotubes.

US 2006/0057767 to Regan et al., (including a present inventor) published Mar. 16, 2006, entitled "Nanoscale mass conveyors," discloses a mass transport method and device for individually delivering chargeable atoms or molecules from source particles is disclosed. It comprises a channel; at least one source particle of chargeable material fixed to the surface of the channel at a position along its length; a means of heating the channel; and a means for applying an controllable electric field along the channel, whereby the device transports the atoms or molecules along the channel in response to an applied electric field.

Peng et al., (including the present inventors) "Ultrahigh Frequency Nanotube Resonators," *Phys. Rev. Lett.* 97, 087203 (Aug. 27, 2006), describes suspended carbon nanotube ("CNT")-based resonators with the fundamental mode frequency over 1.3 GHz and mechanical motion self-detectable at room temperature in air at atmospheric pressure. A combination of drive and detection methods, along with metal nanobridges templated onto the CNT beam, are used to dramatically enhance the response sensitivity (including phase response) and to probe mobility of trapped charges of the NEMS device.

Sazonova et al., "A tunable carbon nanotube electromechanical oscillator," *Nature* 431, 284-287 (16 Sep. 2004) disclose an oscillator comprising nanotubes (typically single- or few-walled, 1-4 nm in diameter and grown by chemical vapor deposition), which are suspended over a trench (typically 1.2-1.5 μm wide, 500 nm deep) between two metal (Au/Cr) electrodes. A small section of the tube resides on the oxide on both sides of the trench; the adhesion of the nanotube to the oxide provides clamping at the suspension points.

Kong et al., "Synthesis of individual single-walled carbon nanotubes on patterned silicon wafers," *Nature* 395:878-881 (29 Oct. 1998) disclose strategy for making high-quality individual SWNTs on silicon wafers patterned with micrometer scale islands of catalytic material.

Knobel et al., "Nanometer-scale displacement sensing using a single electron transistor," Nature 424, 291-293 (17 Jul. 2003) disclose an oscillator which has a 3 µm long 250 nm wide 200 nm thick doubly-clamped beam of single-crystal GaAs, capacitively coupled to an aluminum SET (single electron transistor), located 250 nm from the beam. The charge sensitivity of the SET at cryogenic temperatures is exploited to measure motion by capacitively coupling it to the mechanical resonator. The device yields a displacement sensitivity of $2\times10^{-15}$ m Hz$^{-1/2}$ for a 116-MHz mechanical oscillator at a temperature of 30 mK.

Huang, et al., "Nanoelectromechanical systems: Nanodevice motion at microwave frequencies," Nature 421, 496 (2003) discloses a nanodevice that will operate with fundamental frequencies in the microwave range (greater than 1 gigahertz). The device used 3C—SiC (silicon carbide) films. Optical and electron-beam lithography was used to define, respectively, large-area contact pads and submicrometer-scale, thin metallic-film masks with the device geometry. Each doubly clamped beam pair is positioned perpendicular to a strong magnetic field (3-8 tesla) in vacuo.

BRIEF SUMMARY OF THE INVENTION

The following brief summary is not intended to include all features and aspects of the present invention, nor does it imply that the invention must include all features and aspects discussed in this summary.

The present invention is directed, in certain aspects, to a high frequency nanoscale mechanical oscillator, comprising: a nanostructure extending between a first (drain) electrode and a second (source) electrode, in which the nanostructure (e.g., SWNT) is fixed to a substrate bearing the first and second electrodes. The nanostructure is placed laterally above a third (gate) electrode, such as by being formed across a trench. The trench is adjacent to an intermediate portion of the nanostructure between the first and second electrodes, and further placed to permit lateral mechanical oscillation of the nanostructure in response to a force applied thereto. The force is applied to the nanostructure by an oscillating current in the gate electrode, which is capacitively coupled to the nanostructure. The device further comprises at least one inertial clamp on the nanostructure on the intermediate portion of the nanostructure, said clamp having a linear mass density sufficient to inertially clamp the nanostructure during its mechanical oscillation.

The inertial clamping is exemplified by metal (indium) beads formed on a carbon SWNT. These beads, arrayed along the nanotube, essentially force vibrational movement of the SWNT to take place along shortened segments between the beads.

In another aspect, the present invention is directed to a nanoscale oscillating circuit. This provides a high frequency nanoscale mechanical oscillator, comprising a nanostructure extending, as before, between a first (drain) electrode and a second (source) electrode, fixed to a substrate bearing the first and second electrodes, and placed laterally above a third (gate) electrode which is adjacent to an intermediate portion of the nanostructure between the first and second electrodes, and further placed to permit lateral mechanical oscillation of the nanostructure in response to a force applied thereto. The gate electrode is connected to an oscillator driving the gate electrode at a frequency $\omega$ and providing a carrier signal to a drain electrode at a frequency $2\omega-\Delta\omega$. A detecting amplifier, such as a lock-in amplifier, for monitoring ac current flow through the source at frequency $\Delta\omega$ is also provided. A layer on the nanostructure rigidly fixes the nanostructure in the vicinity of the electrodes.

The above-described oscillators may be made with a nanostructure selected from the group consisting of a single-walled nanotube, a multiwalled nanotube, a nanowire, a nanodisk, and a nanorod. A number of these structures may comprise carbon. One embodiment contains a single-walled carbon nanotube, providing a mechanically oscillating member having a high quality factor. The inertial clamp can be a metal particle having a nominal diameter of at least 5 nm. This serves to anchor a portion of the nanostructure, and, further, allows for tuning of the oscillator by moving the inertial clamps ("beads") after the device has been made. The "beads" may comprise a metal selected from the group consisting of indium, thallium, gallium, tin, titanium, lead, mercury, gold, silver, aluminum, platinum, copper, or mixtures thereof. Indium has desirable vapor and melting characteristics where the bead is to be moved along the nanostructure by mass transport.

The device may further comprise a silicon nitride layer on top of a silicon oxide layer, to facilitate processing.

In one aspect of the invention, the oscillator device comprises the above-cited nanostructure, first (drain) electrode and a second (source) electrode, and (gate) electrode; an electronic oscillator for delivering an oscillating signal to the first (drain) electrode at a pre-selected frequency, or a range of frequencies. In one embodiment, the frequency is $2\omega-\Delta\omega$, where $\omega$ is a frequency of a signal applied by an oscillator to the third (gate) electrode, said frequency being at least 1 GHz, and $\Delta\omega$ being an arbitrary differential; and an amplifier for measuring current from the second (source) electrode at a frequency $\Delta\omega$, indicative of a frequency of nanostructure oscillation. This amplifier may be a lock-in amplifier.

The oscillator may further comprise a frequency doubler for providing a reference signal of $\omega\Delta$ to a lock-in amplifier, said reference signal being derived from a signal at frequency $2\omega$.

The present oscillators may further comprise a current source for moving an inertial clamp axially along the nanostructure. The "tunable" aspect of the present high frequency nanotube oscillators relates to the location of the various inertial clamps along the nanostructure. If the inertial clamps can be moved by mass transport, that is, made to flow along the nanostructure by an electric current, the clamps may be moved to provide different resonance frequencies. A DC current may be applied to drive the inertial clamps ("beads") in one direction or another. The DC current may be applied over the oscillating current to allow for tuning of the oscillator while it is being driven.

By driving the nanostructure at selected frequencies, the resonance frequencies of mechanical movement of the nanostructure can be determined and implemented. This provides for a mechanical oscillation of a nanostructure of at least 1 GHZ in air at ambient temperature, with about 4 GHZ being demonstrated below. It is expected that frequencies as high as 20 GHZ can be obtained by the present device, in air, and at ambient temperatures.

DISCLOSURE OF INVENTION AND BEST MODE FOR CARRYING OUT THE INVENTION

Although the present invention is described with reference to nanotubes, specifically single-walled carbon nanotubes, other nanostructures may be used instead. It should be understood that various references here to nanotubes are illustrative only, and may be applied to other nanostructures as well. The term "nanostructure" is used herein to mean a closed or hollow, discrete particle having a diameter less than 200 nanometers. A "nanotube" is a nanostructure having a length at least ten times its diameter. The nanostructure may exhibit optimum properties with a length between 10 nanometers and 10 microns and a diameter between 0.5 nm and 100 nm. A "nanostructure" as used herein is essentially atomically smooth, having mechanical defects essentially only at places where inertial clamps may be desired. The present nanostructure may contain essentially one material or a mixture of materials, or may be essentially pure, or contain dopants, e.g., carbon doped with Ge, B, P, As, Ge, Ga, In, or Al.

The term "nanostructure" includes nanotubes, nanospheres, nanowires, nanorods, and nanodisks. In the case of non-elongated nanostructures used as resonators, oscillation may be induced by expansion and contraction of the nanostructure, or by a torsional movement.

The term nanotube is used here in a broad sense to include: single-walled nanotubes, multiwalled nanotubes, etc. Other forms of nanotube may be used, so long as they have uniform mechanical properties and are chemically inert to the atoms that are to be transported and used to form the inertial clamps. Some examples include gold, palladium, platinum, $BC_2N$, and BN nanotubes.

The term nanotube includes carbon nanotubes. These may consist of one tube of graphite, a one-atom thick single-wall nanotube (SWNT), or a number of concentric tubes called multiwalled nanotubes (MWNT). SWNTs, although predominantly having a single wall, are understood instances within a given sample of tubes having multiple walls in some cases.

SWNTs are produced by laser vaporization (LV), electric-arc vaporization (AV) and by chemical vapor deposition (CVD). The LV and AV methods produce loose nanotubes, which are grown in the gas-phase from co-vaporized carbon and approximately 1% catalyst metal. CVD utilizes thermal decomposition of a mixture of carbon-containing and metal-catalyst-containing precursor gases (e.g., methane and ferrocene) above a hot substrate.

MWNTs for use in the present oscillator may be synthesized by the standard arc technique as described in Ebbesen et al., U.S. Pat. No. 5,641,466 issued Jun. 24, 1997, hereby incorporated by reference to describe a method for large-scale synthesis of carbon nanotube. These nanotubes have a near perfect carbon tubule structure that resembles a sheet of $sp^2$ bonded carbon atoms rolled into a seamless tube. They are generally produced by one of three techniques, namely electric arc discharge, laser ablation and chemical vapor deposition. The arc discharge technique involves the generation of an electric arc between two graphite electrodes, one of which is usually filled with a catalyst metal powder (e.g., iron, nickel, cobalt), in a Helium atmosphere. The laser ablation method uses a laser to evaporate a graphite target, which is usually filled with a catalyst metal powder too. The arc discharge and laser ablation techniques tend to produce an ensemble of carbonaceous material, which contain nanotubes (30-70%), amorphous carbon and carbon particles (usually closed-caged ones). The nanotubes must then be extracted by some form of purification process before being manipulated into place for specific applications. The chemical vapor deposition process utilizes nanoparticles of metal catalyst to react with a hydrocarbon gas at temperatures of 500-900° C. A variant of this is plasma enhanced chemical vapor deposition in which vertically aligned carbon nanotubes can easily be grown. In these chemical vapor deposition processes, the catalyst decomposes the hydrocarbon gas to produce carbon and hydrogen. The carbon dissolves into the particle and precipitates out from its circumference as the carbon nanotube. Thus, the catalyst acts as a 'template' from which the carbon nanotube is formed, and by controlling the catalyst size and reaction time, one can easily tailor the nanotube diameter and length respectively to suit. Carbon tubes, in contrast to a solid carbon filament, will tend to form when the catalyst particle is ~50 nm or less because if a filament of graphitic sheets were to form, it would contain an enormous percentage of 'edge' atoms in the structure. Alternatively, nanotubes may be prepared by catalytic pyrolysis of hydrocarbons as described by Endo, et al., in *J. Phys. Chem. Solids*, 54, 1841 (1993), or as described by Terrones, et al., in *Nature*, 388, 52 (1997) or by Kyotani, et al., in *Chem. Mater.*, 8, 2190 (1996), the contents of all of which are incorporated by reference for describing nanotube preparation.

The bonding in carbon nanotubes is $sp^2$, with each atom joined to three neighbors, as in graphite. The tubes can therefore be considered as rolled-up graphene sheets (graphene is an individual graphite layer). There are three distinct ways in which a graphene sheet can be rolled into a tube.

The first two of these, known as "armchair" and "zig-zag," have a high degree of symmetry. The terms "armchair" and "zig-zag" refer to the arrangement of hexagons around the circumference. The third class of tube, which in practice is the most common, is known as chiral, meaning that it can exist in two mirror-related forms. The various structures determine the conductivity of the nanotube, which may be "metallic" or semiconducting. All forms work in the present invention.

The strength of the $sp^2$ carbon-carbon bonds gives carbon nanotubes particular mechanical properties. The stiffness of the material, measured in terms of its Young's modulus, the rate of change of stress with applied strain, can be as high as 1000 GPa, which is approximately 5× higher than steel. The tensile strength, or breaking strain of nanotubes can be up to 63 GPa, around 50× higher than steel. These properties, coupled with the lightness of carbon nanotubes make them particularly preferred in the present oscillators.

Exemplary nanowires include aluminum, e.g., Ono et al., "Magnetic orderings in Al nanowires suspended between electrodes," *Applied Physics Letters*—Jun. 23, 2003—Volume 82, Issue 25, pp. 4570-4572; those described in Geng et al., "Synthesis and optical properties of S-doped ZnO nanowires," Synthesis and optical properties of S-doped ZnO nanowires," *Applied Physics Letters*—Jun. 30, 2003—Volume 82, Issue 26, pp. 4791-4793; "Self-assembled growth of epitaxial erbium disilicide nanowires on silicon (001)" by Yong Chen, Douglas A. A. Ohlberg, Gilberto Medeiros-Ribeiro, Y. Austin Chang, and R. Stanley Williams in *Applied Physics Letters*, 76, p. 4004, June 2000, and silicon nanowires as described in Englander et al., "Local synthesis of silicon nanowires and carbon nanotubes on microbridges," *Applied Physics Letters*—Jun. 30, 2003—Volume 82, Issue 26, pp. 4797-4799.

Nanorods may be carbon (see, e.g., *Science* 10 Sep. 1999: Vol. 285. no. 5434, pp. 1719-1722); metal oxide (see U.S. Pat. No. 6,036,774); silicon carbide (see U.S. Pat. No. 5,997,832); metals and metal alloys such as copper, nickel and gold, see e.g., Salem et al., "Multi-component nanorods for vaccination applications," *Nanotechnology* 16 484-487, 2005.

Although the placement of the SWNT in the present application was done by placement of Fe islands for catalysis in CVD, techniques known in the art may be adapted to place other nanostructures, such as those described above. For example, polymers may be patterned on the substrate, and the pre-formed nanotubes flowed across the substrate at a concentration and rate whereby they stick to the polymer in a defined orientation. Another method of placing a nanostructure in a predefined position is described in U.S. Pat. No. 6,962,823 to Empedocles, et al., issued Nov. 8, 2005, entitled "Methods of making, positioning and orienting nanostructures, nanostructure arrays and nanostructure devices." Described there are methods of forming nanowires (or any other small or one-dimensional structure, e.g., a nanodot, nanoribbon, nanotetrapod, etc.) and corresponding arrays with any of a variety of properties by patterning nanostructure catalysts and/or precursors on a substrate. Nanostructure catalysts and/or precursors are heated, melting into spheres that influence the eventual diameter and location of nanostructures made from the spheres.

Alternatively, a nanostructure for use in the present invention may be formed directly from a substrate by photolithographic and etching techniques. It would then have the composition of the substrate layer from which it was formed.

The term "inertial clamp" means, as described in further detail below, a discrete formation of a material which has a linear mass density (i.e., mass per unit length of nanostructure) sufficient essentially to eliminate lateral vibrational movement of the nanostructure to which it is applied, without physical attachment to anything but the nanostructure on which it sits. The inertial clamp may comprise a metallic material, which can move along the nanostructure in response to a current allowing the inertial clamp to be moved along the nanostructure to a selected position. Metals for forming the clamp include indium, thallium, gallium, tin, titanium, lead, mercury, gold, silver, aluminum, platinum, copper, or mixtures thereof. Inertial clamps may also be formed of metal oxides and other compounds. For example, $Al_2O_3$ and $HfO_2$ can form balls on carbon nanotubes. Visually, an inertial clamp may resemble a bead threaded onto the nanostructure to which it is attached.

The term "electronic oscillator" is used in its standard sense, i.e., an electronic circuit that produces a repetitive electronic signal, often a sine wave or a square wave.

Other terms used in the present specification are used in their standard sense. A "doubler," refers to an electronic device that doubles the frequency of an input signal. A "mixer" is an electronic device for mixing two or more electronic signals. There are two basic types of mixer, additive and multiplying. Exemplified herein is a frequency mixer (multiplying mixer) in which the frequency of the output signal for such mixer is the sum or the difference of the input frequencies.

The term "resonance frequency" is used in its standard sense, and is described mathematically below from the output of the lock-in amplifier of the circuit of FIG. 2, where amplifier output current is fit to an appropriate phase shift between the driving voltage and the oscillation of the nanotube. Essentially, it represents a frequency for a given nanostructure at which the amplitude of movement in the mechanical vibration of the nanostructure is greatest. The fundamental resonance frequency is the lowest resonance frequency, and there will be harmonics of the frequency, such as the second harmonic and so forth.

The term "nominal diameter" refers to the diameter of a sphere or tube having the same volume and mass as the measured structure, which may be irregular in shape.

The term "nanoscale" means a size less than 1 μm (1000 nm).

The term "substrate" means an inert, rigid member used to support structures thereon or therein. Typical substrates include silicon, glass, plastic, ceramic, etc. A substrate may be formed of carbon, which may be amorphous or in the form of graphite, diamond, etc. A substrate may include additional layers on its surface.

FIG. 1A shows schematically an oscillator configuration 10. A single-wall carbon nanotube (CNT) 28 is grown by chemical vapor deposition across a trench 16 between metal source 20 and drain 18 electrodes on a silicon wafer. An independent gate electrode 22 is located at the bottom of the trench 16. Following CNT growth, metal beads 30, 32, 34 are placed abacus-style on the CNT 28 by thermally evaporating metal (such as indium) over the entire device 10.

FIG. 1B shows a typical beaded or "mass loaded" CNT segment. When driven mechanically, the CNT exhibits transverse-beam-like flexure modes. The shortened CNT segments between two adjacent indium beads can serve as a resonating beam, and the short effective clamped length results in ultra-high resonance frequencies. Placement of the beads (i.e., inertial clamps) is akin to a musician placing fingers on a musical string to select specific notes. Using appropriate electrical currents through the CNT, the bead distribution on the CNT can be altered after the device is fabricated, allowing the lengths of the intervening CNT segments to be lengthened or shortened and therefore the frequencies of the segments to decrease or increase, respectively.

FIGS. 1A and C illustrate a nanostructure 28 comprising beads 30, 32 and 36 disposed along the nanostructure 28 in the region of the trench 16 (shown in FIG. 1A). The forces shown by arrow 36, created by oscillating current in gate 22, and capacitance between the gate and the nanostructure, cause the nanostructure as a whole to be vibrated toward and away from the gate 22. However, the beads (inertial clamps) 30, 32 and 34 prevent vibrations from traveling the entire length of the nanostructure, in effect acting as anchors. Thus a single wave, as shown at 38, (or waves) moves between an end and a bead or between two beads. Shown in FIG. 1C is a wave 38 at a first harmonic. Other harmonics exist, as is known, and one harmonic is the resonance frequency, where the vibrations tend to be the greatest. If the distances between the beads is not equal, that is, if the intervening nanostructure segment lengths are different, there are several different harmonic frequencies, allowing generation of signals at several discrete frequencies.

The resonance frequency of the nanostructure 28 is determined by the device itself. When the driving frequency of arrow 36 is near that intrinsic resonance frequency, resonant motion occurs.

The resonance frequency of a beam is proportional to $1/L^2$, where L is the effective beam length, e.g., the length of the segment between beads 30 and 32. Thus, a short segment of the entire length of the nanostructure has a high resonance frequency. For equally distributed beads, each intervening nanostructure section has the same length and therefore the same resonance frequency. But in general, the beads are not distributed evenly and the shortest nanostructure section gives the highest fundamental mode frequency.

In certain embodiments, an optical or mechanical contact 35 is provided to interact with the nanostructure 28 and either affect or be effected by the mechanical oscillation of the nanostructure. For example, contact 35 may be a laser beam that is scanned across the nanostructure so that the oscillations can modulate the laser beam. As another example, contact 35 may be a small particle or membrane to be probed with the oscillating nanostructure. Physical contact with the contact element 35 will cause detectible variations in the oscillation of nanostructure 28.

Referring now to FIG. 1A, a silicon wafer 10 is provided as a substrate. Examples of other substrate materials that may be used include $Al_2O_3$ and various types of glass ($SiO_2$).

A silicon dioxide layer 12 is located on an outer surface of silicon wafer 10, and provides insulation. The $SiO_2$ layer was formed in a commercially obtained, thermally grown product, but other methods of growing an $SiO_2$ layer, as are known in the art, such as low pressure chemical vapor deposition or plasma enhanced chemical vapor deposition may be used. The thickness used was 500 nm, but any thickness of material providing insulation between the source and drain may be used.

Next, a silicon nitride layer 14 is applied on top of the silicon oxide layer 12 in order to provide a convenient mask for subsequent buffered HF etching of the $SiO_2$ layer. It can be applied to a thickness of about 50 nm and may be between about 1 nm and 2 µm thick. The silicon nitride layer can be deposited by low-pressure chemical vapor deposition, e.g., from $NH_3$ and $SiH_2Cl_2$.

Various substrate combinations may be used besides silicon, silicon oxide and silicon nitride. Such materials include sapphire, and semiconductors such as germanium, III-V compound semiconductors, whether binary (e.g., GaAs, InP, etc.), ternary (e.g., InGaAs), or higher (e.g., InGaAsP), II-VI compound semiconductors, and IV-VI compound semiconductors. Specific examples of semiconductor substrate materials include Si, Ge, $Ge_xSi_{1-x}$ where $0<x<1$, GaAs, InAs, AlGaAs, InGaAs, AlGaAs, GaN, InN, AlN, AlGaN, and InGaN. Specific examples of metal substrate materials include Al, Cu, Ti, Cr, Fe, Co, Ni, Zn, Ga, Nb, Mo, Pd, Ag, In, Ta, W, Re, Os, Ir, Pt, and Au, and alloys thereof.

In one embodiment of the invention, the source and drain electrodes are patterned on the substrate; then, a nanostructure growth catalyst (e.g., Fe) is patterned onto the source and drain electrodes; then a trench is patterned in the gap area between SD electrodes; then a gate electrode was patterned on the bottom of the trench. Finally, the nanostructure was applied. In the example below, CVD is used to grow single-walled carbon nanotubes bridging the source and drain electrodes.

Referring to FIG. 1, drain 18 and source electrodes 20 can be formed on either side of the trench location 16 either before or after the trench is formed. For electrical contacts, the trench can be extended into any larger pad outside of the gap area by lithography and etching.

Several micron wide electrodes (Pt 20 nm/Cr 5 nm) were applied. The gap between source 20 and drain 18 electrodes is typically between about 300 nm to 1 µm. The source 20 and drain 18 electrodes are patterned by e-beam lithography and lift off processing. The formed electrodes 18, 20 are placed on either side of a gap between 300 nm to 1 µm. Depending on the dimensions of the device being patterned, photolithography can also be employed.

After forming the source and drain electrodes, Fe catalyst is applied for the purpose of positioning the carbon nanostructures (in a later step) across the trench. Fe catalyst 24 is vapor deposited on the source 20 and drain 18 electrodes in a very thin layer, by thermal evaporation in a vacuum of $10^{-6}$ torr. The Fe coverage is typically $5 \times 10^{15}$ atoms/$cm^2$, corresponding to a few monolayers.

As described above, the $SiO_2$ 12 and $Si_3N_4$ 14 layers are applied as a continuous layer. Then, photolithographic techniques and resist are used to remove selected portions of the $Si_3N_4$. The underlying silicon dioxide layer is then removed by etching. The etching forms "trenches," or depressions in the silicon nitride and silicon dioxide, across which the nanostructures can be formed later. An e-beam lithography step, reactive ion etching, and buffered HF etching are carried out to pattern the trench 16. The trench depth is typically between 200 and 500 nm.

In another lithography process, a successive evaporation of Pt 20 nm/Cr 5 nm and then a lift off process form a local gate 22 on the bottom of the trench 16.

A methane CVD growth method can be used to form the nanotube nanostructure 28 across the trench 16. Nanotubes began to grow on the Fe catalyst island 24, and grow in the direction of arrow 26, which represents the direction of vapor flow during the CVD process. Alternatively, directionality may be improved by the addition of a bias voltage.

Single-walled carbon nanotubes are grown in a quartz tube oven at a temperature of 900° C. in the flow of methane (1000 sccm) for 4-20 min. Heating of the oven and subsequent cooling are done in an argon flow.

The tubes are fixed to the underlying electrodes by various forces, such as Van der Waal's forces, and contact with the underlying electrodes 18, 20, which may become softened during processing.

A nominal 2.5 nm thick layer of indium is applied to the oscillator configuration 10 by thermal evaporation. This results in formation of discrete indium particles 30, 32, 34 on the nanotube 28. The particles 30, 32, 34 generally have between about 1 nm and 200 nm nominal diameters. Most metals when applied by such a method form discrete particles, rather than a coating. For purposes of the present method and device, the particles act as inertial clamps, as described above. In one embodiment of the invention there is at least one inertial clamp 30. In another embodiment, there are between about 3 and 10 inertial clamps on the nanostructure. In other embodiments, there can be any number of inertial nanoclamps on the nanostructure; the longer the nanostructure, the more inertial clamp are possible.

FIG. 2A is a schematic circuit diagram of the drive and detection electronics for a 2ω mixing method. An actuation voltage signal of amplitude $\delta V_g$ at a frequency ω is applied to the gate G, while a carrier voltage signal of amplitude $\delta V_d$ is applied to the drain D at a frequency 2ω−Δω. The current flow through the source S at the frequency Δω (typically set at 7 KHz) is monitored using a lock-in amplifier with a time constant 300 ms. The lock-in reference at the frequency Δω is obtained through a frequency doubler and a mixer. The effective driving frequency on the oscillator is 2ω, the frequency of the electrostatic force induced by the gate voltage signal.

A signal generator 200 provides an oscillating input signal through a filtering capacitor 202 at a frequency 2ω−Δω, to drain electrode 18, where it is conducted across the nanostructure 28, to the source electrode 20, and then to the input of a lock-in amplifier 204.

A second signal generator 206 delivers a signal at frequency ω through capacitor 208 and to the gate electrode 22. The signal at frequency ω is also passed to a doubler 212 and input to mixer 210, where it is mixed with the signal from the first oscillator 200 (at frequency 2ω−Δω) and provides a reference signal Δω to the lock-in amplifier 204. The lock-in amplifier 204 used in the present experiments was a SRS 850, from Stanford Research Systems. Essentially, it serves to provide a DC signal output proportional to the AC signal from the source electrode 20 at the frequency of the reference input, i.e., the mixer output. The AC signal from the source electrode 20 varies as the nanotube oscillates. The lock-in amplifier, as is known in the art, is based on phase sensitive detection. That is, it operates by demodulation or rectification of an AC signal by a circuit which is controlled by a reference waveform derived from the device which caused the signal to be modulated (in this case Δω). The phase sensitive detector effectively responds to signals that are coherent (same frequency and phase) with the reference waveform and rejects all others.

Further details may be found in *American Journal of Physics* 62 (2) 129-133 (February 1994).

Thus, the lock-in amplifier measures the drain-source current at the intermediate frequency $\Delta\omega$ (~7 kHz). Using the nanotube as a nonlinear mixing element allows for "self detection" of the mechanical motion without the need for more complex transduction (such as magnetomotive).

FIG. 2B is a diagram showing actuation gate signal $\delta V_g$ and the corresponding response in charge q, force F, conductance G and Fourier transform of conductance $\chi_G$ under ideal conditions with no accumulated charge (left) and with finite accumulated charge $q_0$ (right).

As shown in FIG. 2B, with a sinusoidal actuation voltage signal applied to the gate 22 at a frequency $\omega$ (forcing the CNT at $2\omega$, a natural consequence of the fact that the electrostatic force on a capacitor (as indicated by "Cg" in FIG. 2) is proportional to the square of the voltage-induced charges), and a carrier signal applied to the drain 18 at a frequency $2\omega-\Delta\omega$, the drain-source current is measured at the intermediate frequency $\Delta\omega$ (~7 kHz) by a lock-in amplifier. Using the nanotube as a nonlinear mixing element allows for "self detection" of the mechanical motion without the need for more complex transduction (such as magnetomotive).

The mechanical oscillations of the nanotube create electrical signals through mechanical deformation of the nanotube (see T. W. Tombler et al., *Nature*, 2000, 405, 769). When the nanotube is oscillating, the strain along the nanotube between the fixed points (inertial clamps) causes conductance changes. This is particularly true in metallic nanotubes. In addition, in semiconducting nanotubes, the gate voltage Vg induces an additional charge on the nanotube given by q=CgVg, where Cg is the capacitance between the gate and the tube. The transistor properties of the present device and the semiconducting property of the nanotube result in a conductance change which is proportional to the change in the induced charge q on the tube. When the tube moves, the distance to the gate changes, resulting in a variation in capacitance The current resulting from the modulated conductance is "mixed" in the nanotube with the AC current applied to the drain, and changes are detected in the lock-in amplifier 204.

FIG. 2B illustrates, with a gate signal frequency $\omega_0$, how the frequency spectrum of the nanotube conductance G is sensitive to trapped charge $q_0$ configurations. Here q is the induced (capacitance) charge leading to an electrostatic force F on the CNT (nanotube) with $q_0$ the excess accumulated charge. G is the resultant CNT electrical conductance, and $\chi_G$ is the Fourier transform of G. The left column presents the ideal case where there is no accumulated static charge ($q_0=0$) near the CNT. A constant capacitance and a linear response of the conductance to the force or the position displacement are assumed. Under such "ideal" conditions, the conductance response only displays a $2\omega$ component in the Fourier spectrum, i.e., the effective actuation frequency is $2\omega$, instead of the gate voltage frequency $\omega$. In this special case, an experiment performed using the $2\omega$ method would show a strong resonance, while a measurement using the $1\omega$ method would yield no resonance signal at all. The right column in FIG. 2B shows the more general case with finite accumulated charge $q_0$ influencing the nanotube. In this case both $1\omega$ and $2\omega$ components appear in the conductance response. As the accumulated charge $q_0$ increases, the $1\omega$ component increases and eventually dominates the response (assuming $q_0$ has sufficient mobility to be modulated by the RF gate signal). Hence, the mechanical response at $\omega_0$ and $2\omega_0$ reflects the excess device charge and the mobility thereof.

That is, if the excess charge is tightly trapped and can't be modulated by an AC gate signal, the $2\omega$ component will dominate. If the excess charge is mobile enough to be tunable by the AC gate signal, the $1\omega$ component will dominate.

An alternative DC mixing circuit is show in FIG. 3. In this embodiment, "A" represents a DC amplifier. Referring now to FIG. 3, an RF signal at frequency $\omega$ is sent to the drain electrode "D". The gate "G" and the source "S" are grounded, as shown, while the DC current flowing through the source "S" is monitored by the DC current amplifier "A". If the frequency $\omega$ is swept through the resonance frequency of the NEMS resonator, i.e., the nanostructure 18 between the drain "D" and source "S", a peak of the DC current would be observed. Therefore, the mechanical resonance can be detected through a simple measurement of the DC current. The operation principle comes from the mixing effect of the device. When an RF signal is applied as described, part of the RF signal becomes a carrier signal between the drain "D" and the source "S", while in the meantime, part of the RF signal forms an actuation signal between the drain "D" and the gate "G". The mixing of the carrier and the actuation signal gives a DC current through the source electrode "S". At resonance of the mechanical motion, this mixing effect will be at a maximum.

Once the oscillator as illustrated in FIG. 1 has been fabricated, it can be coupled to electronics such as shown in FIG. 2A. However, the present oscillator need not have a doubler and mixer circuit, as described above. An oscillator drives the gate voltage. The electronics are connected to the source, drain and gate electrodes according to conventional techniques. The oscillator may be part of a higher order device, such as is used for avionics, wireless communications, optical filters, etc. Since the resonance frequency of the nanotube is dependent on mass, it can be also used to detect contact with nanoscale particles, as in atomic force microscopy and other sensing applications.

The present devices are further advantageous in that they may be made tunable, that is the resonance frequency or frequencies can be changed during operation of the device by changing the position of the inertial clamps, or in similar fashion, causing clamps to shrink and grow. Such a technique is described in detail in Regan et al., US 2006/0057767, cited above. In this embodiment, one causes mass transport of the metal in the inertial clamp(s) by means of a current through the nanotube, i.e., between the source and drain. The current through the nanotube establishes both an electric field and heating, sufficient to cause inertial clamp size changes. Thus, it is useful that the nanotube be capable of carrying a current of more than 20 microamperes. It is also useful that the material comprising the inertial clamp have a low vapor pressure near its melting point, otherwise material can be lost.

FIG. 4 is a pair of graphs showing (A) amplitude (in logarithmic scale) and (B) phase of the electrical current as a function of effective driving frequency f in a vacuum of $10^{-6}$ Torr (triangles) and in air (circles) for a nano-abacus oscillator, measured with a gate signal $\delta V_g=158$ mV and a drain signal $\delta V_d=70$ mV by the $2\omega$ mixing method. A fundamental mode resonance is clearly observed at 3.80 GHz at a pressure $10^{-6}$ Torr (triangles), and at 3.79 GHz at atmospheric pressure (circles). The pressure-induced shift is likely due to the adsorption of air-specific molecules (such as water or oxygen) on the SWNT, leading to a change of the oscillator mass. Such extreme molecular-level mass-sensitivity is an intrinsic advantage of light-mass NEMS oscillators. Note that for suspended bare carbon nanotube oscillators, the mechanical resonance is usually much weaker in atmospheric pressure, or even not detectable at all. However, as shown in FIG. 4, microwave operation in air can be easily achieved with the present oscillators.

From the full width at half depth from the amplitude data, we estimate that the quality factor Q changes from ~58 in a vacuum of $10^{-6}$ Torr to ~44 in ambient pressure air. Note that the phase signal (FIG. 4B) experiences a much sharper change at the resonance, due to the interference effect of the background response and the resonance response. On resonance in vacuum, within a frequency range of 9 MHz, there is an easily detectable phase change of ~72° (half of the total phase change due to the resonance). In analog to a pure Lorentzian type signal, we define a "phase quality factor" $Q_p = \omega_0/\Delta\omega_1$, where $\omega_0$ is the resonance frequency and $\Delta\omega_1$ is the frequency interval by which the phase change accounts for 50% of the total phase change near resonance. Here, we have $\Delta\omega_1 \sim 9$ MHz, leading to an effective "phase quality factor" $Q_p \sim 420$. Therefore, the phase signal offers great advantage in detecting the frequency shift for sensing applications.

The fundamental mode resonance frequency $\omega_0$ is related to oscillator physical properties by $$\omega_0/2\pi = 1.259 \cdot \sqrt{E/\rho} \cdot (d/L^2) \quad (1)$$

where E is the Young's modulus, $\rho$ is the density, d is the diameter and L is the length of the CNT segment between two inertial clamps. To obtain Eq. (1), the CNT is treated as a thin-wall cylinder. With d=3.5 nm, $\rho$=2.25 g/cm³ (density of graphite), and $\omega_0/2\pi$=3.8 GHz relevant for the device of FIG. 4, and taking E~100 Gpa, we estimate an effective vibrating beam length L~90 nm, consistent with longer CNT sections between inertial clamps as observed by SEM (scanning electron microscope). In light of the $1/L^2$ scaling of the resonance frequency, the beaded CNT approach offers great potential in realizing NEMS oscillators with extremely high resonance frequency even into the terahertz region. Indeed, the shorter CNT segments depicted in FIG. 1B of typical length ~10 nm are expected to resonate at ~0.4 THz.

To our knowledge, the oscillator with the present "nano-abacus" configuration is the first reported air-operational practical NEMS oscillator in the giga-hertz range. To gain insight into the mechanism of ambient-pressure operation, we address below the issue of energy dissipation and analyze the quality factor Q of the system. For a doubly clamped beam oscillator, the energy dissipation can occur either through the air in contact with the beam (air damping), or through the supports in contact with the substrate (clamping loss). The clamping loss is caused by the radiation of elastic energy into the support substrate through the coupling between the resonator motion and the phonon modes. Unfortunately, quantitative analyses of NEMS loss mechanisms have been rather limited. Therefore, we explore the issue theoretically here.

Air damping can occur in the molecular region or the viscous region, depending on the ratio of the mean free path of gas molecules to the size of the resonator beam. The molecular mean free path $l_{mfp}$ can be expressed as $l_{mfp}$=0.23 k $T/D^2p$, where k is the Boltzmann constant, D the diameter of gas molecules, T the temperature and p the pressure. For air at standard condition, $l_{mfp}$ is ~65 nm. The typical diameter d of single-wall carbon nanotube resonators is 1 to 5 nm. Therefore, $l_{mfp}/d$>10, and the air damping should be in the molecular region, i.e., the damping is mainly caused by the momentum transfer due to collisions between air molecules and the moving surface of the vibrating beam. Here we use the kinetic theory of gases to estimate the drag force (FIG. 5). Since the air molecule mass m is much less than the resonator mass M, a collision from a molecule moving opposite to the vibrating resonator beam induces a momentum loss of $2m(V_z+V_0)$ to the beam in the elastic scattering limit, where $V_z$ is the velocity of the molecule and $V_0$ is the velocity of the beam. On the other hand, a collision with the molecule moving in the same direction as the beam contributes a momentum gain of $2m(V_z-V_0)$ to the resonator beam. FIG. 5 is a schematic diagram of a collision between a gas molecule with velocity $V(v,\theta,\phi)$ and a vibrating beam with velocity $V_0$ along the z axis. For molecules with a velocity $V(v,\theta,\phi)$ (in spherical coordinates), within a small time interval dt only those inside the cylinder can collide with the beam surface dS. Summing up the contributions of collisions from both sides of the beam, we obtain, using a Maxwellian distribution, a net momentum transfer $$\Delta P = \int_0^\infty \left(\frac{m}{2\pi kT}\right)^{\frac{3}{2}} e^{-\frac{mv^2}{2kT}} v^2 dv \int_0^{\frac{\pi}{2}} \sin\theta \, d\theta \int_0^{2\pi} d\phi \cdot \quad (2)$$

$$n \cdot dS \cdot vdt\sin\theta \cdot 4mV_0$$

$$= \sqrt{2\pi nkT} \cdot n \cdot V_0 \cdot dS \cdot dt$$

where n is number of molecules per unit volume. The resultant net drag force per unit area is $$\Delta F = \sqrt{2\pi mkT} \cdot n \cdot V_0 = \sqrt{\frac{2\pi m}{kT}} \cdot p \cdot V_0, \quad (3)$$

where we have used n=p/kT for the ideal gas, with p the air pressure. This leads to a damping term in the Euler-Bernoulli equation as $$\rho A \frac{\partial^2 u(x,t)}{\partial t^2} + EI \frac{\partial^4 u(x,t)}{\partial x^4} + \eta \frac{\partial u(x,t)}{\partial t} = f(x)e^{-i\omega t}, \quad (4)$$

where u(x,t) is the displacement of beam neutral axis, $\rho$ is the beam density, A is the beam cross-sectional area, E is the Young's modulus, I is the bending moment of inertia, f(x) is the drive force per unit length and $\omega$ the drive frequency. From Eq. (3), the damping coefficient $\eta$ is obtained as $$\eta = \sqrt{\frac{2\pi m}{kT}} \cdot p \cdot b, \quad (5)$$

with b being the beam width.

Solving the Euler-Bernoulli equation gives a fundamental mode amplitude $$a_0 = \frac{c}{\omega_0^2 - \omega^2 - i\frac{\omega_0 \omega}{Q_{air}}}, \quad (6)$$

with c a constant (independent of $\omega$) and $\omega_0$ the fundamental mode resonance frequency. The air damping induced quality factor is $$Q_{air} = \omega_0 \cdot \frac{\rho A}{\eta}. \quad (7)$$

From Eq. (5) and Eq. (7), we obtain theoretically an air-damping quality factor $Q_{air} \sim 143$ in the elastic scattering limit for the device shown in FIG. 5, by taking a beam width b=3.5 nm, a beam cross-sectional area A=8 nm$^2$, a density $\rho$=2.25 g/cm$^3$ and a resonance frequency $\omega_0/2\pi$=3.8 GHz.

Considering the contribution from both the air damping and the clamping loss, the overall quality factor Q satisfies $1/Q = 1/Q_{air} + 1/Q_{clamp}$, where $Q_{air}$ and $Q_{clamp}$ are induced by the air and the clamping, respectively. In a vacuum of $10^{-6}$ Torr, the contribution due to air damping is negligible and the clamping loss dominates the Q factor. Therefore, for the device shown in FIG. 5, we can estimate a clamping-induced quality factor from the experimentally observed total quality factor, $Q_{clamp} \sim 58$. From the data in air, the overall Q decreases to ~44. Thus we can extract an air-induced quality factor from the experiment as $Q_{air} = (1/Q - 1/Q_{clamp})^{-1} \sim 182$, which is close to the theoretical value ~143 estimated above. The discrepancy may originate from the simple kinetic calculation assuming a perfect elastic scattering in obtaining Eq. (2). In general, to account for all possible scattering effects, we can introduce an empirical scattering factor $\beta$ in the momentum transfer calculation due to an individual collision event, whereby the momentum loss (gain) induced by a collision of a gas molecule moving against or along the vibrating direction of the beam can be expressed as $2\beta m(V_z + V_0)$ and $2\beta m(V_z - V_0)$, respectively, with $\beta$ ranging from 0 to 1. Therefore, we have a general expression of the air-damping induced quality factor as $$Q_{air} = \omega_0 \cdot \frac{\rho A}{\eta \beta}. \quad (8)$$

Using the experimentally extracted value $Q_{air} \sim 182$, we obtain an empirical scattering factor $\beta \sim 0.8$ for the device relevant to FIG. 4.

An important point from Eq. (8) is that the air-induced quality factor is proportional to the resonance frequency. Thus a higher quality factor can be obtained with a higher resonance frequency and this naturally explains why room temperature air-operation is realized in our microwave frequency nano-abacus oscillator, while operation above a pressure of 10 Torr is not possible in oscillators with lower frequency.

In one embodiment of the invention, a high frequency nanoscale mechanical oscillator has a nanostructure extended between a first electrode and a second electrode and a gate electrode adjacent an intermediate portion of the nanostructure. The gate electrode is positioned to permit mechanical oscillation of the nanostructure. There is a bead of material attached to the intermediate portion of the nanostructure. In one arrangement, the nanostructure can be any of a single-walled nanotube, a multi-walled nanotube, a nanowire, a nanodisk, or a nanorod. The bead has a linear mass density sufficient to inertially clamp the nanostructure during its mechanical oscillation. In one arrangement, the bead is a metal particle having a nominal diameter of at least 5 nm. The bead may be made of any of indium, thallium, gallium, tin, titanium, lead, mercury, silver, aluminum, platinum, copper, gold, or mixtures thereof. The oscillator may have a current source in communication with the nanostructure. The current source is configured to supply current sufficient to cause movement of the bead along the nanostructure. The oscillator may have an electronic oscillator for driving the gate electrode at a frequency $\omega$ and providing a carrier signal to the first electrode at a frequency $\omega - \Delta\omega$. The oscillator may have a detecting amplifier for monitoring ac current flow through the second electrode at frequency $\Delta\omega$.

In another embodiment of the invention, an oscillator device has a nanostructure extended between a drain electrode and a source electrode. There is a gate electrode adjacent an intermediate portion of the nanostructure and positioned to permit lateral mechanical oscillation of the nanostructure in response to a force applied thereto. There are also an electronic oscillator for delivering an oscillating carrier signal to the drain electrode and a detecting amplifier for measuring current flow through the source electrode. The device may have a second electronic oscillator for delivering a signal with frequency $\omega$ to the gate electrode. The frequency $\omega$ may be greater than or equal to 1 GHz. The electronic oscillator may be adapted to deliver a frequency $\omega - \Delta\omega$ to the drain electrode. The detecting amplifier may be adapted to measure the current at a frequency $\Delta\omega$. The device may also have a frequency doubler for providing a reference signal with frequency $\Delta\omega$ to a lock-in amplifier, the reference signal being derived from a signal at frequency $\omega$. The device may also have at least one inertial clamp on the intermediate portion of the nanostructure. The clamp has a linear mass density sufficient to clamp the nanostructure inertially during mechanical oscillation. The device may have a current source in communication with the nanostructure for moving the inertial clamp along the nanostructure.

In another embodiment of the invention, a high frequency nanoscale mechanical oscillator, has a nanotube extended between a source electrode and a drain electrode and a gate electrode adjacent an intermediate portion of the nanotube, positioned to permit mechanical oscillation of the nanotube. There is an indium bead attached to the intermediate portion of the nanostructure. The oscillator may also have an electronic oscillator for driving the gate electrode at a frequency $\omega$ and providing a carrier signal to the first electrode at a frequency $\omega - \Delta\omega$. The oscillator may also have a detecting amplifier for monitoring ac current flow through the second electrode at frequency $\Delta\omega$.

In another embodiment of the invention, a method for generating a mechanical oscillation of a nanostructure of at least 1 GHZ uses a nanostructure fixed at end regions and suspended between a source electrode and a drain electrode and laterally proximate to a gate electrode. The method involves attaching at least one inertial clamp to the nanostructure between the source and drain electrodes, thereby partitioning the nanostructure into nanostructure segments. Then the nanostructure is vibrated through capacitive coupling of the nanostructure and the gate electrode, where the gate electrode is driven at a frequency $\omega$. Thus, at least one of the nanostructure segments vibrates at a fundamental resonance frequency at a frequency of at least 1 GHz. The method may include the step of adjusting the position of the inertial clamp along the nanostructure. The adjusting may be done while the nanostructure is vibrated. The adjusting may be accomplished by running a current through the nanostructure.

In another embodiment of the invention, a method of making a high frequency nanoscale mechanical oscillator, includes the steps of: a) providing a substrate with a first electrode and a second electrode; b) forming a trench between the first electrode and the second electrode; c) forming a gate electrode in the trench; d) attaching a nanostructure to the first electrode and to the second electrode; e) depositing material to form material beads on the nanostructure; and f) providing an electronic oscillator for delivering a carrier signal to the first electrode and for driving the gate electrode. The carrier signal may have a frequency of $\omega-\Delta\omega$ and the gate electrode may be driven at a frequency $\omega$.

The above specific description is meant to exemplify and illustrate the invention and should not be seen as limiting the scope of the invention, which is defined by the literal and equivalent scope of the appended claims. Alternative embodiments from those exemplified are possible. For example, nanostructures in the form of spheres may be used, and made to oscillate radially. In this or other embodiments, the inclusion of a trench is optional. Beads may be placed at various locations on the spherical surface, or other clamps, or no clamps may be used.

Any patents or publications mentioned in this specification are indicative of levels of those skilled in the art to which the patent pertains and are intended to convey details of the invention which may not be explicitly set out but which would be understood by workers in the field. Such patents or publications are hereby incorporated by reference to the same extent as if each was specifically and individually incorporated by reference, as needed for the purpose of describing and enabling the method or material referred to.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

Figure 1:
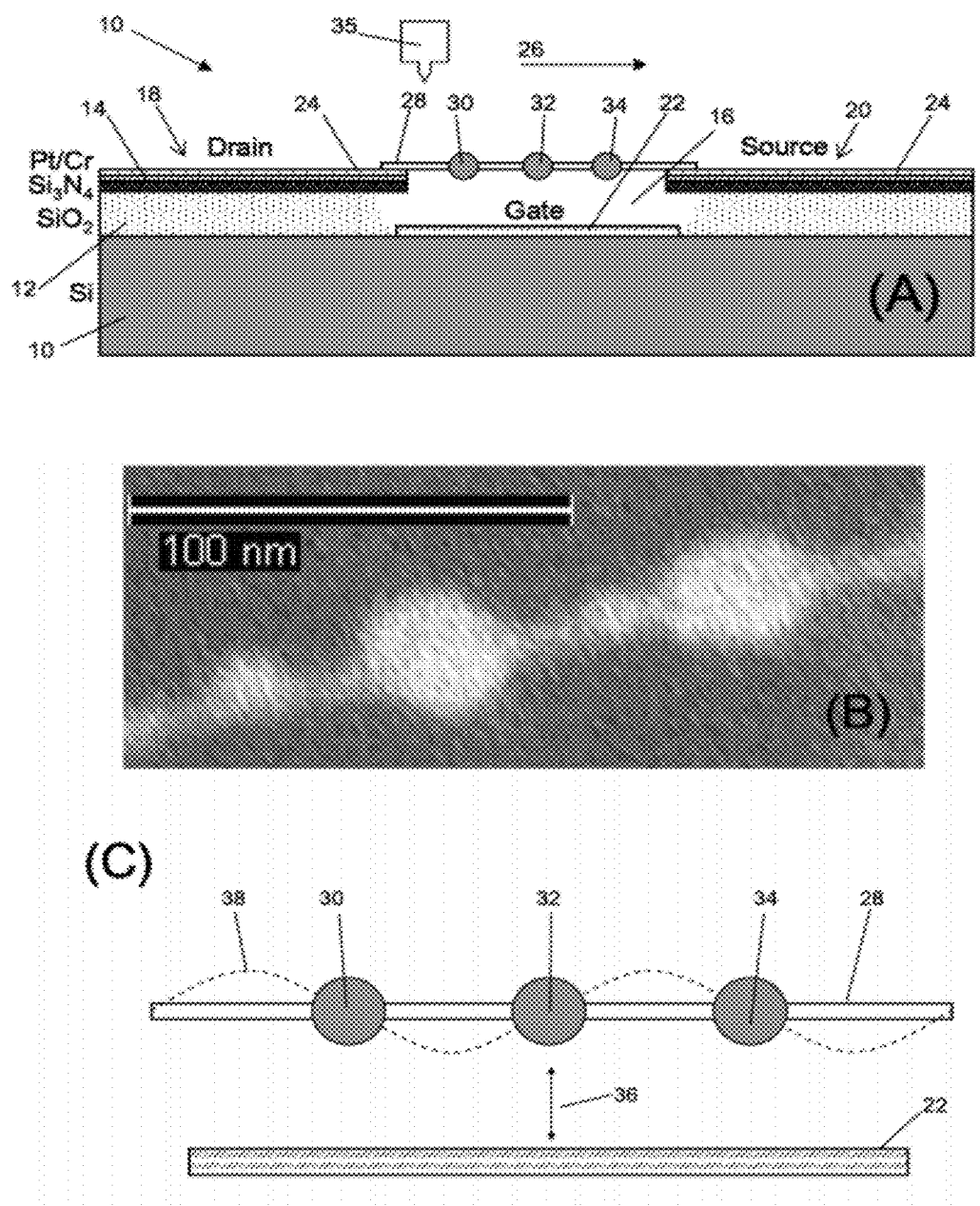
FIG. 1A is a schematic cross-section of a nanotube oscillator. A suspended carbon nanotube bridges source and drain electrodes with a local gate lying nearby.
FIG. 1B is a scanning electron micrograph of a nano-abacus made by evaporating nominal 2.5 nm thick indium onto a CNT.
FIG. 1C is a schematic drawing that shows a nanotube with three beads vibrating at a first harmonic.
Figure 2:
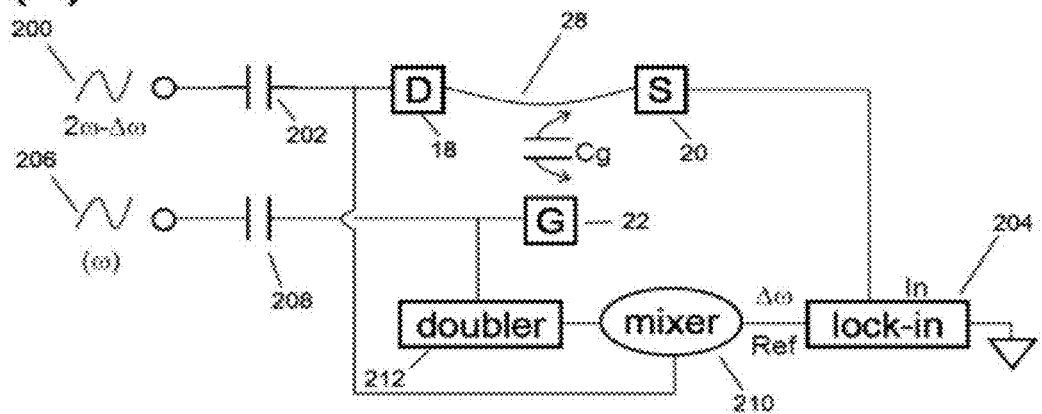
FIG. 2A is a schematic circuit diagram of the drive and detection electronics for a $2\omega$ mixing method.
FIG. 2B is a diagram showing actuation gate signal $\delta V_g$ and the corresponding response in charge q, force F, conductance G and Fourier transform of conductance $\chi_G$ under ideal conditions with no accumulated charge (left) and with finite accumulated charge $q_0$ (right).
Figure 2:
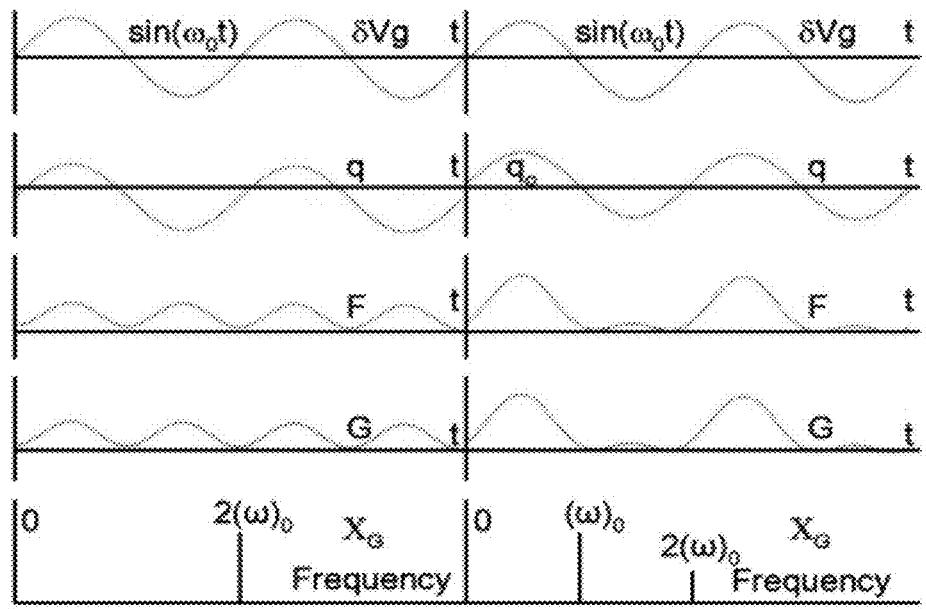
Figure 3:
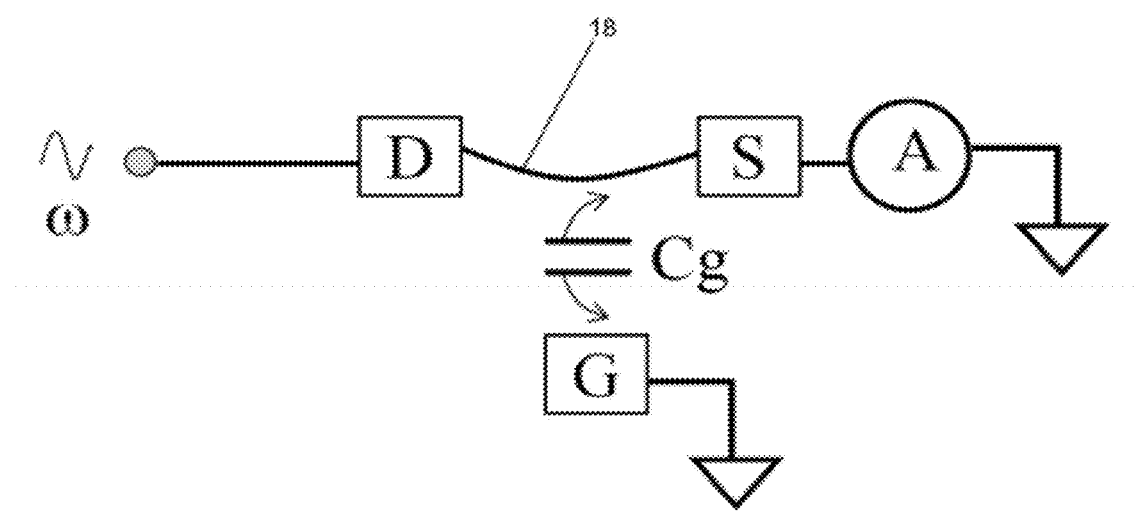
FIG. 3 is a schematic circuit diagram of a DC mixing circuit.
Figure 4:
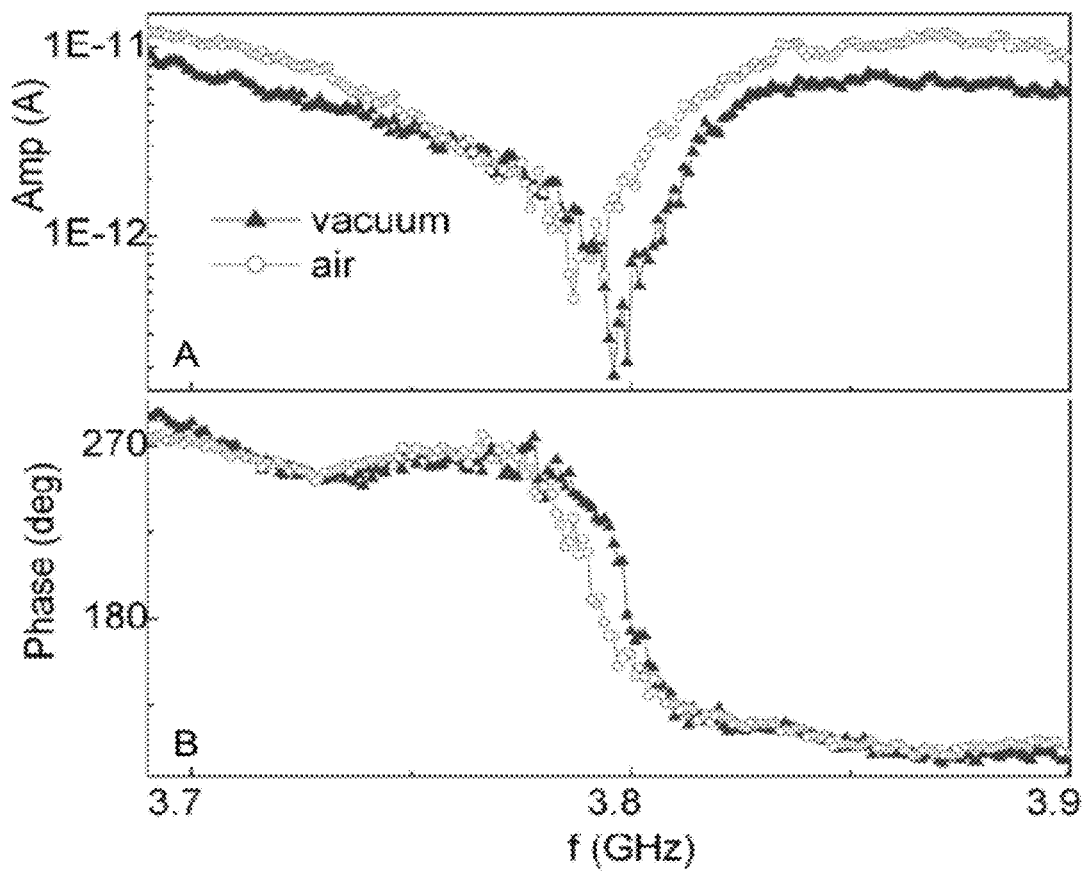
FIG. 4 is a pair of graphs showing (A) amplitude (in logarithmic scale) and (B) phase of the electrical current as a function of effective driving frequency f.
Figure 5:
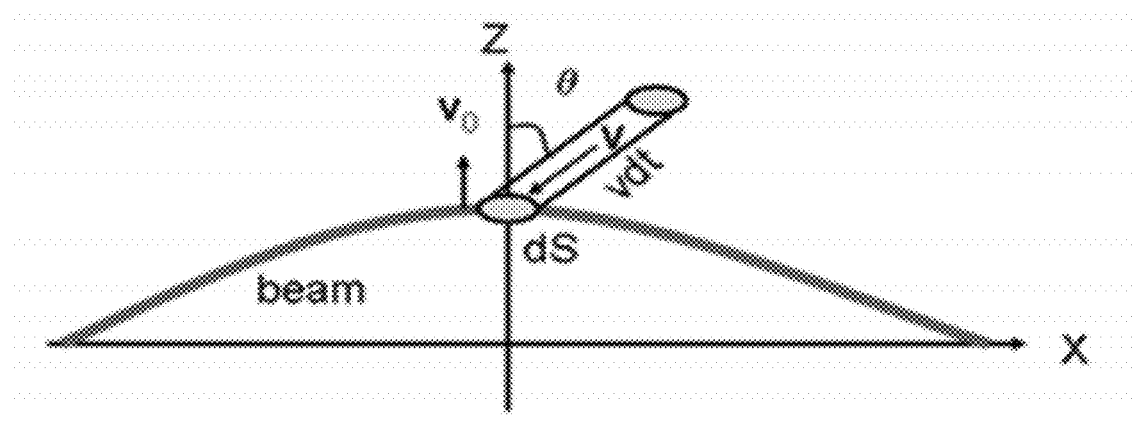
FIG. 5 is a schematic diagram of a collision between a gas molecule with velocity $V(v,\theta,\phi)$ and a vibrating beam with velocity $V_0$ along the z axis.

We claim:

1. A high frequency nanoscale mechanical oscillator, comprising:
   a nanostructure extended between a first electrode and a second electrode;
   a gate electrode adjacent an intermediate portion of the nanostructure and positioned to permit mechanical oscillation of the nanostructure;
   a bead of material attached to the intermediate portion of the nanostructure; and a current source in communication with the nanostructure, the current source configured to supply current sufficient to cause movement of the bead along the nanostructure.

2. An oscillator device comprising:
   a nanostructure extended between a drain electrode and a source electrode;
   a gate electrode adjacent an intermediate portion of the nanostructure and positioned to permit lateral mechanical oscillation of the nanostructure in response to a force applied thereto;
   a first electronic oscillator for delivering an oscillating carrier signal to the drain electrode;
   a detecting amplifier for measuring current flow through the source electrode;
   at least one inertial clamp on the intermediate portion of the nanostructure, the clamp having a linear mass density sufficient to clamp the nanostructure inertially during mechanical oscillation; and
   a current source in communication with the nanostructure for moving the inertial clamp along the nanostructure.

3. A method for generating a mechanical oscillation of a nanostructure of at least 1 GHZ, wherein the nanostructure is fixed at end regions and suspended between a source electrode and a drain electrode and is laterally proximate to a gate electrode, comprising:
   attaching at least one inertial clamp to the nanostructure between the source and drain electrodes, thereby partitioning the nanostructure into nanostructure segments;
   vibrating the nanostructure through capacitive coupling of the nanostructure and the gate electrode, where the gate electrode is driven at a frequency $\omega$, whereby at least one of the nanostructure segments vibrates at a fundamental resonance frequency at a frequency of at least 1 GHz; and
   adjusting the position of the inertial clamp along the nanostructure.

4. The method of claim 3 wherein the adjusting is done while vibrating the nanostructure.

5. The method of claim 3 wherein the adjusting is accomplished by running a current through the nanostructure.

* * * * *